United States Patent
Shim et al.

(10) Patent No.: US 9,349,424 B2
(45) Date of Patent: May 24, 2016

(54) SEMICONDUCTOR APPARATUS CONFIGURED TO MANAGE AN OPERATION TIMING MARGIN

(71) Applicant: SK hynix Inc., Icheon-si Gyeonggi-do (KR)

(72) Inventors: Seok Bo Shim, Icheon-si (KR); Hee Jin Byun, Icheon-si (KR); Jong Ho Jung, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/488,603

(22) Filed: Sep. 17, 2014

(65) Prior Publication Data

US 2015/0364172 A1 Dec. 17, 2015

(30) Foreign Application Priority Data

Jun. 12, 2014 (KR) .................. 10-2014-0071252

(51) Int. Cl.
*G11C 7/10* (2006.01)
*G11C 7/22* (2006.01)

(52) U.S. Cl.
CPC .............. *G11C 7/222* (2013.01); *G11C 7/225* (2013.01)

(58) Field of Classification Search
CPC .......... G11C 7/22; G11C 7/222; G11C 7/106; G11C 7/1006; G11C 7/1051; G11C 7/1057; G11C 7/1072; G11C 7/1078
USPC ............. 365/189.02, 189.05, 189.15, 189.17, 365/194, 233.1, 233.11, 233.12
See application file for complete search history.

(56) References Cited

U.S. PATENT DOCUMENTS 6,388,945 B2 * 5/2002 Aikawa ................ G11C 7/1066
365/194
8,050,374 B2 * 11/2011 Kim ....................... G11C 16/32
375/354

FOREIGN PATENT DOCUMENTS

KR 100656464 B1 12/2006

* cited by examiner

*Primary Examiner* — Tha-O H Bui
(74) *Attorney, Agent, or Firm* — William Park & Associates Ltd.

(57) ABSTRACT

A semiconductor apparatus may include a read path configured to transmit data from the semiconductor apparatus in response to a read command and at least one read operation control signal, and an operation control circuit configured to receive a plurality of divided clock signals and the read command to identify the one of the plurality of divided clock signals that is relatively better matched to the received read command to manage timings associated with at least one of the read operation control signals.

20 Claims, 14 Drawing Sheets

SEMICONDUCTOR APPARATUS CONFIGURED TO MANAGE AN OPERATION TIMING MARGIN

CROSS-REFERENCES TO RELATED APPLICATION

The present application claims priority under 35 U.S.C. §119(a) to Korean application number 10-2014-0071252, filed on Jun. 12, 2014, in the Korean Intellectual Property Office, which is incorporated herein by reference in its entirety.

BACKGROUND

1. Technical Field

Various embodiments generally relate to a semiconductor apparatus, and more particularly, to a semiconductor apparatus configured to manage an operation timing margin.

2. Related Art

A semiconductor apparatus typically receives a command, such as for example a read command, based on an external clock signal, processes the received command based on an internal clock signal, and outputs a resultant signal from the semiconductor apparatus. An example of an internal clock signal is a delay-locked loop clock signal.

As the frequency of the external clock signals increase to accommodate relatively high speed operations of a semiconductor apparatus, an internal operation timing margin is often managed to enable the performance of such operations. An example of a relatively high speed operation of a semiconductor apparatus is a high speed read operation.

SUMMARY

In an embodiment, a semiconductor apparatus may include a read path configured to transmit output data from the semiconductor apparatus in response to a read command and at least one read operation control signal, and an operation control circuit configured to receive a plurality of divided clock signals and the read command and to identify the one of the plurality of divided clock signals that is relatively better matched to the received read command to manage timings associated with the at least one read operation control signal.

In an embodiment, a semiconductor apparatus may include a delay-locked loop configured to divide at least one delay-locked clock signal to generate a plurality of divided internal clock signals, wherein the at least one delay-locked clock signal is generated in response to at least one external clock signal, a domain conversion unit configured to generate first and second time domain conversion signals in response to a read command, first and second of the plurality of divided internal clock signals, and at least one column timing signal, a read operation control circuit configured to generate at least one read operation control signal in response to an activated signal and the plurality of divided internal clock signals, wherein the activated signal is one of the first and second time domain conversion signals, and a read path configured to transmit data from the semiconductor apparatus in response to the read command and the at least one read operation control signal.

DETAILED DESCRIPTION

Various embodiments of a semiconductor apparatus configured to manage an operation timing margin will be described below with reference to the accompanying drawings.

An embodiment is directed to managing an operation timing margin for a read operation of a semiconductor apparatus in response a read command RD using divided delay-locked internal clock signals. The divided delay-locked internal clock signals may be generated by dividing delay-locked internal clock signals. The divided delay-locked internal clock signals may include first, second, third and fourth divided internal clock signals ICLK, ICLKB, QCLK, QCLKB.

The second divided internal clock signal ICLKB may have a phase that is opposite to the phase of the first divided internal clock signal ICLK. The fourth divided internal clock signal QCLKB may have a phase that is opposite to the phase of the third divided internal clock signal QCLK.

When a read command RD is received at the semiconductor apparatus based on an external clock signal CLK, it may be difficult to ascertain whether the timing of the received read command RD is relatively better matched to the timing of the first divided internal clock signal ICLK or to the timing of the second divided internal clock signal ICLKB.

Figure 1:
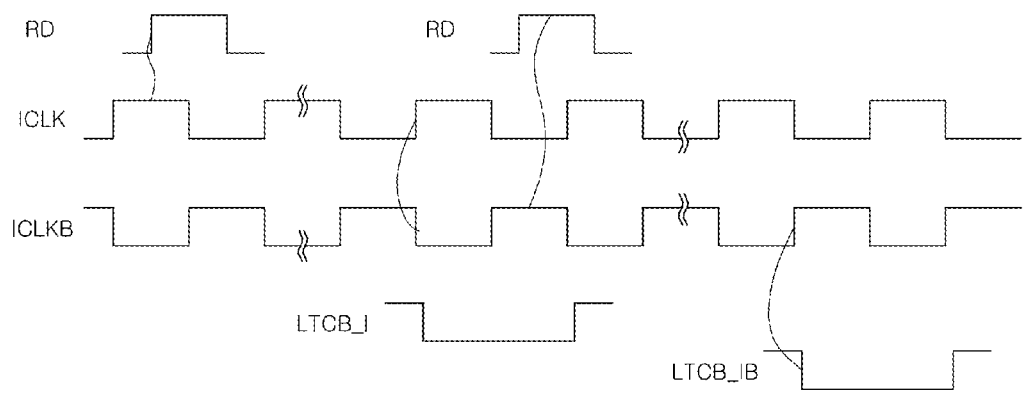
FIG. 1 is a timing diagram associated with an operation of an embodiment of a semiconductor apparatus.

Referring to FIG. 1, first and second time domain conversion signals LTCB_I, LTCB_IB may be used to determine whether the received read command RD is relatively better matched to the timing of the first divided internal clock signal ICLK or the timing of the second divided internal clock signal ICLKB.

The first time domain conversion signal LTCB_I may serve as a reference for a read operation, when the timing associated with the received read command RD is relatively better matched to the first divided internal clock signal ICLK.

The second time domain conversion signal LTCB_IB may serve as a reference for a read operation, when timing associated with the received read command RD is relatively better matched to the second divided internal clock signal ICLKB.

Figure 2:
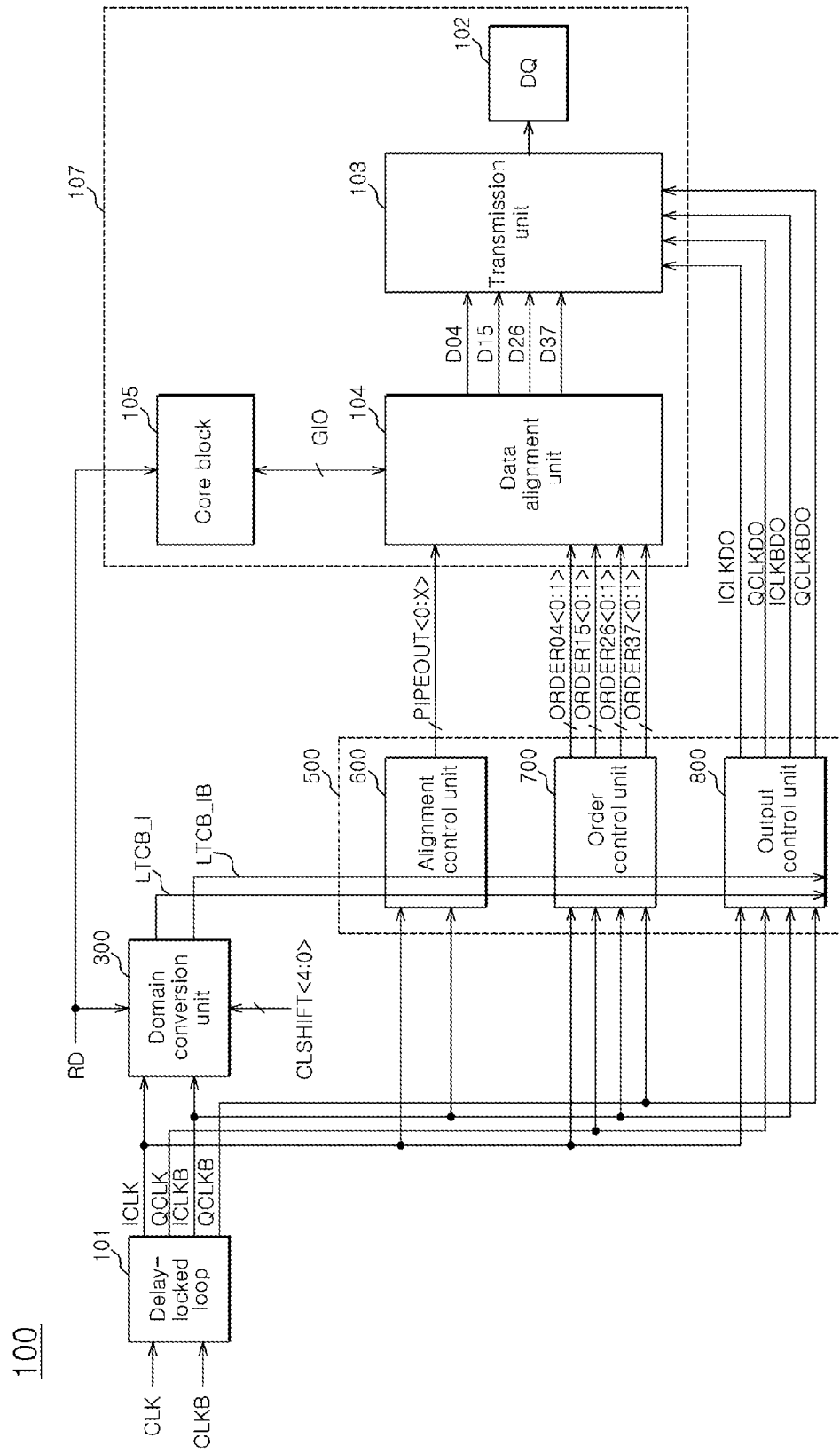
FIG. 2 is a block diagram representation of an embodiment of a semiconductor apparatus 100.

Referring to FIG. 2, an embodiment of a semiconductor apparatus 100 may include a delay-locked loop 101, a read path 107, a domain conversion unit 300, and a read operation control circuit 500. In an embodiment an operation control circuit comprises a domain conversion unit and a read operation control circuit.

The delay-locked loop 101 may be configured to generate delay-locked clock signals in response to external clock signals CLK and CLKB, and divide the generated delay-locked clock signals to generate the first, second, third, and fourth divided delay-locked internal clock signals ICLK, ICLKB, QCLK and QCLKB.

The domain conversion unit 300 may be configured to generate the first and second time domain conversion signals LTCB_I, LTCB_IB in response to a read command RD, the first divided internal clock signal ICLK, the second divided internal clock signal ICLKB, and column timing signals CLSHIFT<4:0>.

The column timing signals CLSHIFT<4:0> may be generated based on a CAS (column address strobe) latency (CL) signal.

The domain conversion unit 300 may be configured to determine whether the timing associated with the received read command RD is relatively more synchronized with the first divided internal clock signal ICLK or the second divided internal clock signal ICLKB, and to activate one of the first and second time domain conversion signals LTCB_I, LTCB_IB based on the determination.

The domain conversion unit 300 may be configured to apply a latency corresponding to the column timing signals CLSHIFT<4:0>, to the activated one of the first and second time domain conversion signals LTCB_I, LTCB_IB.

The read operation control circuit 500 may be configured to generate read operation control signals in response to the activated one of the first and second time domain conversion signals LTCB_I, LTCB_IB and the first, second, third and fourth divided internal clock signals ICLK, ICLKB, QCLK, QCLKB. The read operation control signals may include alignment control signals PIPE_OUT<0:X>, order control signals ORDER04<0:1>, ORDER15<0:1>, ORDER26<0:1>, ORDER37<0:1> and output enable signals ICLKDO, ICLKBDO, QCLKDO, QCLKBDO.

The read operation control circuit 500 may include an alignment control unit 600, an order control unit 700, and an output control unit 800.

The alignment control unit 600 may be configured to generate the alignment control signals PIPE_OUT<0:X> in response to the activated one of the first and second time domain conversion signals LTCB_I, LTCB_IB and the first and second divided internal clock signals ICLK, ICLKB.

The order control unit 700 may be configured to generate the order control signals ORDER04<0:1>, ORDER15<0:1>, ORDER26<0:1>, ORDER37<0:1> in response to the activated one of the first and second time domain conversion signals LTCB_I, LTCB_IB and the first, second, third and fourth divided internal clock signals ICLK, ICLKB, QCLK, QCLKB.

The output control unit 800 may be configured to generate the output enable signals ICLKDO, ICLKBDO, QCLKDO, QCLKBDO in response to the activated one of the first and second time domain conversion signals LTCB_I, LTCB_IB and the first, second, third and fourth divided internal clock signals ICLK, ICLKB, QCLK, QCLKB.

The read path 107 may be configured to output data from the semiconductor apparatus 100 in response to the read command RD and the read operation control signals. The read operation control signals include the alignment control signals PIPE_OUT<0:X>, the order control signals ORDER04<0:1>, ORDER15<0:1>, ORDER26<0:1>, ORDER37<0:1> and the output enable signals ICLKDO, ICLKBDO, QCLKDO, QCLKBDO.

The read path 107 may include a data output unit 102, a transmission unit 103, a data alignment unit 104, and a core block 105.

The data output unit 102 may include a plurality of pads (not shown) and drivers (not shown) for driving the plurality of pads.

The transmission unit 103 may be configured to transmit alignment data D04, D15, D26, D37 to the data output unit 102 in response to the output enable signals ICLKDO, ICLKBDO, QCLKDO, QCLKBDO.

The core block 105 may be configured to transmit stored data via a global line GIO in response to the read command RD.

The core block 105 may include a memory block and one or more circuits associated with the reading of data from the memory block and the writing of data to the memory block.

The data alignment unit 104 may be configured to align the data transmitted from the core block 105 via the global line GIO in response to the alignment control signals PIPE_OUT<0:X> and the order control signals ORDER04<0:1>, ORDER15<0:1>, ORDER26<0:1>, ORDER37<0:1>, and to generate the alignment data D04, D15, D26, D37.

Figure 3:
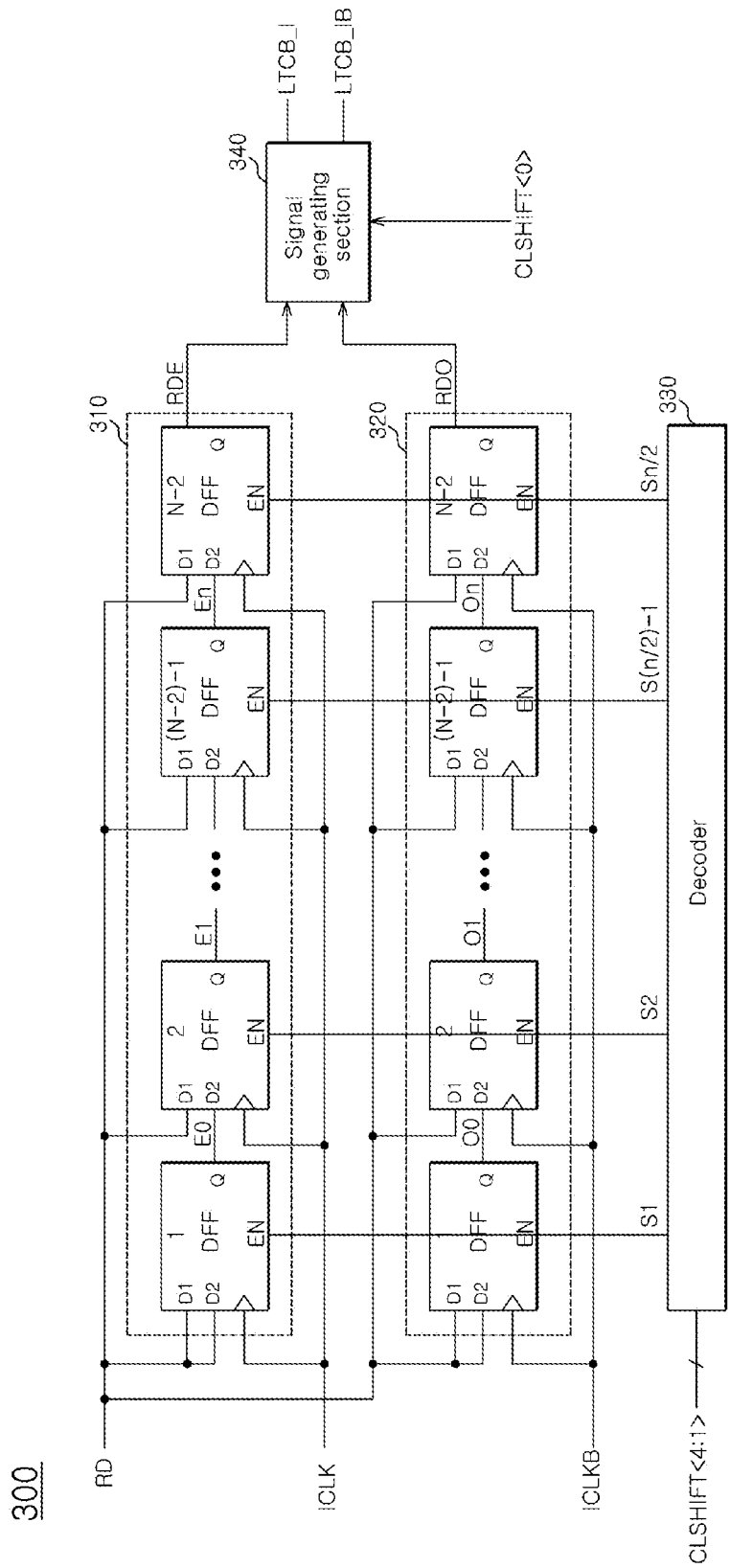
FIG. 3 is a circuit diagram representation of an embodiment of the domain conversion unit 300 of FIG. 2.

Referring to FIG. 3, an embodiment of the domain conversion unit 300 may include a first shift path 310, a second shift path 320, a decoder 330, and a signal generating section 340.

The first shift path 310 may be configured to shift the read command RD in response to shift control signals S1-Sn/2 and the first divided internal clock signal ICLK and generate a first preliminary signal RDE.

The first shift path 310 may include a plurality of flip-flops DFF.

Each of the plurality of flip-flops DFF may be activated in response to the signal bits of an associated shift control signal S1-Sn/2.

As each of the flip-flops DFF are activated in response to the associated shift control signal S1-Sn/2, the activated flip-flop DFF may latch and output the read command RD in response to the rising edge of the first divided internal clock signal ICLK.

The deactivated flip-flops DFF may latch and output the output signals of previous flip-flops DFF in response to the rising edge of the first divided internal clock signal ICLK.

The second shift path 320 may be configured to shift the read command RD in response to the shift control signals S1-Sn/2 and the second divided internal clock signal ICLKB, and generate a second preliminary signal RDO.

The second shift path 320 may include a plurality of flip-flops DFF.

Each of the plurality of flip-flops DFF may be activated in response to the associated shift control signals S1-Sn/2.

As each of the flip-flops DFF are activated in response to the associated shift control signal S1-Sn/2 the activated flip-flop DFF may latch and output the read command RD in response to the rising edge of the second divided internal clock signal ICLKB.

The deactivated flip-flops DFF may latch and output the output signals of previous flip-flops DFF in response to the rising edge of the second divided internal clock signal ICLKB.

The decoder 330 may be configured to decode the column timing signals CLSHIFT<4:1> that follow the least significant bit of the column timing signal CLSHIFT<0> and generate the shift control signals S1-Sn/2. In other words, the decoder 330 ignores the least significant bit of the column timing signal CLSHIFT<0>.

The signal generating section 340 may be configured to activate one of the first and second time domain conversion signals LTCB_I, LTCB_IB in response to the first preliminary signal RDE, the second preliminary signal RDO and the least significant bit of the column timing signals CLSHIFT<0>.

Figure 4:
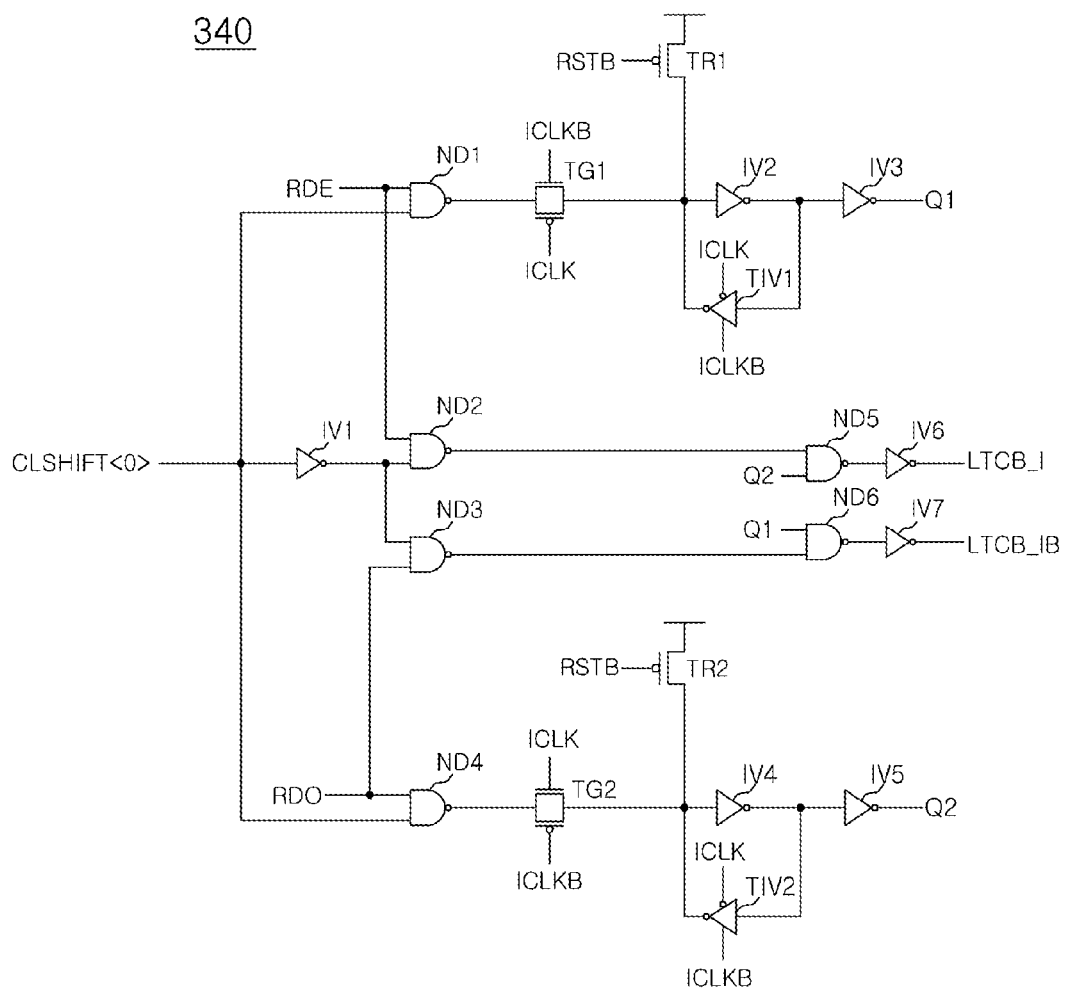
FIG. 4 is a circuit diagram representation of an embodiment of the signal generating section of FIG. 3.

Referring to FIG. 4, an embodiment of the signal generating section 340 may include a plurality of logic elements. The plurality of logic elements may include a first, second, third, fourth fifth, sixth and seventh inverters IV1-IV7, first, second, third, fourth, fifth and sixth NAND gates ND1-ND6, first and second transmission gates TG1, TG2, first and second tri-state inverters TIV1, TIV2, and a first and second transistors TR1, TR2.

When a reset signal RSTB is activated and has a low level, first and second internal signals Q1, Q2 may be reset to a high level by the first and second transistors TR1, TR2, respectively.

Since the first and second internal signals Q1, Q2 are at a high level and both the first preliminary signal RDE and the second preliminary signal RDO have a low level when the reset signal RSTB is activated, the first and second time domain conversion signals LTCB_I, LTCB_IB may be reset to a high level.

Figure 5:
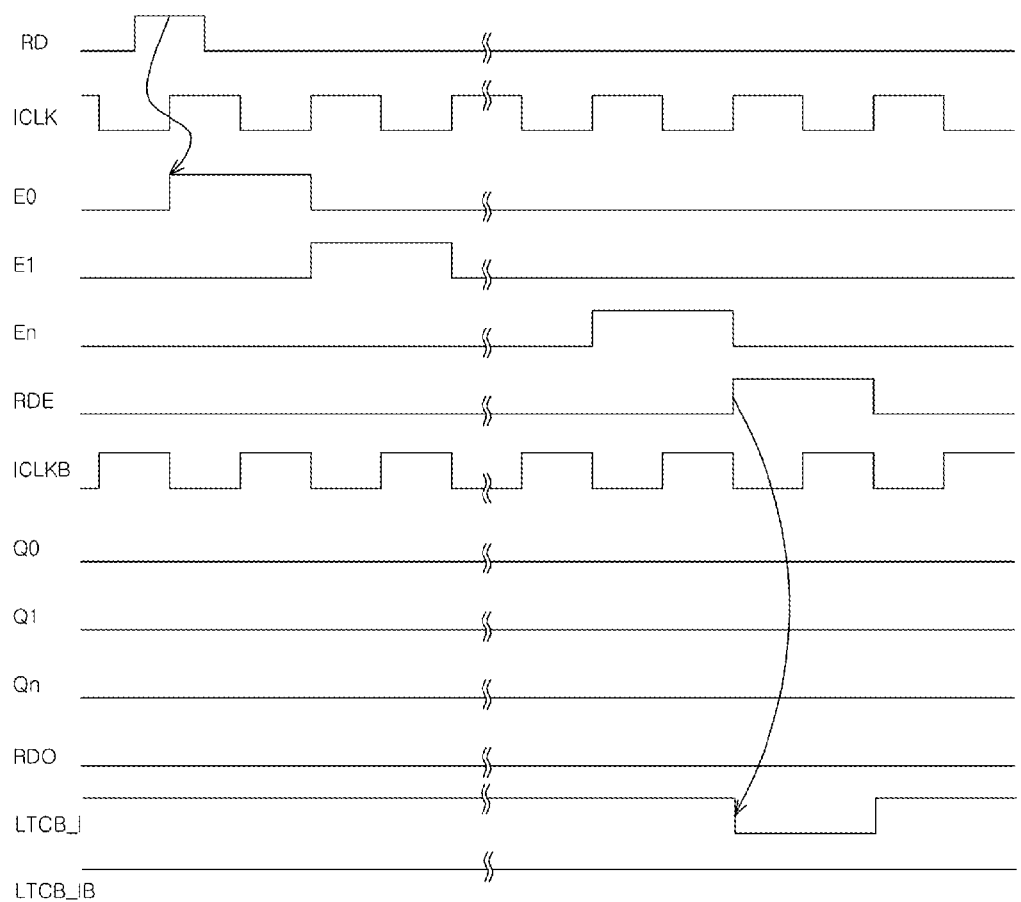
FIGS. 5 to 8 are operation timing diagrams associated with an operation of an embodiment of the domain conversion unit of FIG. 3.

The operation of the domain conversion unit 300 in response to the least significant bit of the column timing signal CLSHIFT<0> having a low level and a read command RD being received based on the rising edge of the first divided internal clock signal ICLK will be described below with reference to FIGS. 3, 4 and 5.

The read command RD is responsively shifted through the first shift path 310 and the first preliminary signal RDE is generated.

When the least significant bit of the column timing signal CLSHIFT<0> has the low level, the first internal signal Q1 is generated at a high level by a logic element combination of the first NAND gate ND1, the first transmission gate TG1, and the second and third inverters IV2, IV3. In addition, when the least significant bit of the column timing signal CLSHIFT<0> has the low level, the second internal signal Q2 is generated at a high level by a logic element combination of the fourth NAND gate ND4, the second transmission gate TG2, and the fourth and fifth inverters IV4, IV5.

Since the least significant bit of the column timing signal CLSHIFT<0> has a low level and the first and second internal signals Q1, Q2 have a high level, the first preliminary signal RDE may be inverted by the logic element combination of the second NAND gate ND2, the fifth NAND gate ND5 and the sixth inverter IV6 and may transition the first time domain conversion signal LTCB_I to an activation level. An example of an activation level of the first time domain conversion signal LTCB_I is a low level.

In addition, when the least significant bit of the column timing signal CLSHIFT<0> has the low level and the second preliminary signal RDO also has the low level, the second time domain conversion signal LTCB_IB may be maintained at a deactivation level. An example of a deactivation level of the second time domain conversion signal LTCB_IB is a high level.

Figure 6:
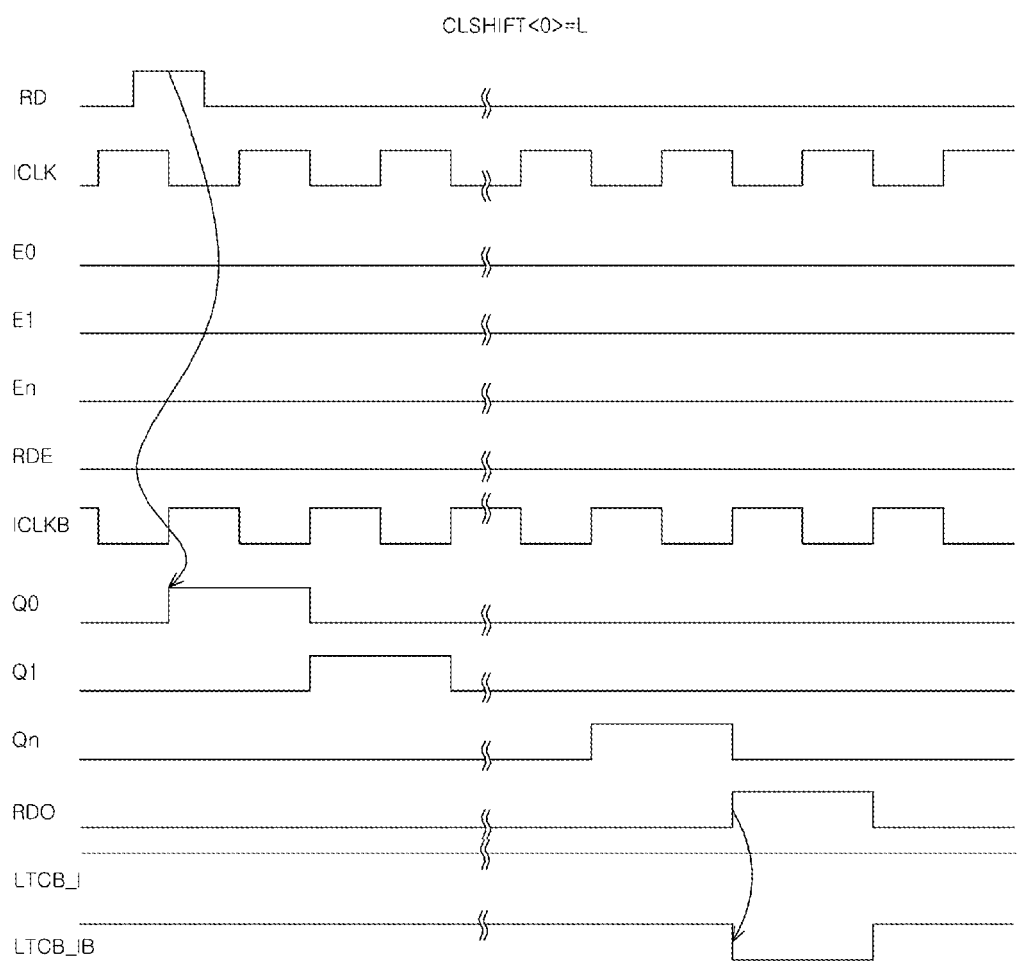

The operation of the domain conversion unit 300 in response to the least significant bit of the column timing signal CLSHIFT<0> having a low level and a read command RD being received based on a rising edge of the second divided internal clock signal ICLKB will be described below with reference to FIGS. 3, 4 and 6.

The read command RD is responsively shifted through the second shift path 320 and the second preliminary signal RDO is generated.

When the least significant bit of the column timing signal CLSHIFT<0> has a low level, the first internal signal Q1 is generated at a high level by a logic element combination of the first NAND gate ND1, the first transmission gate TG1, and the second an third inverters IV2, IV3. In addition, the second internal signal Q2 is generated at a high level by a logic element combination of the fourth NAND gate ND4, the second transmission gate TG2, and the fourth and fifth inverters IV4, IV5.

Since the least significant bit of the column timing signal CLSHIFT<0> has a low level and the first and second internal signals Q1, Q2 have a high level, the second preliminary signal RDO may be inverted by a logic element combination of the third NAND gate ND3, the sixth NAND gate ND6 and the seventh inverter IV7 and may transition the second time domain conversion signal LTCB_IB to a low level.

In addition, when the least significant bit of the column timing signal CLSHIFT<0> has a low level and the first preliminary signal RDE has a low level, the first time domain conversion signal LTCB_I may be maintained at a high level.

Figure 7:
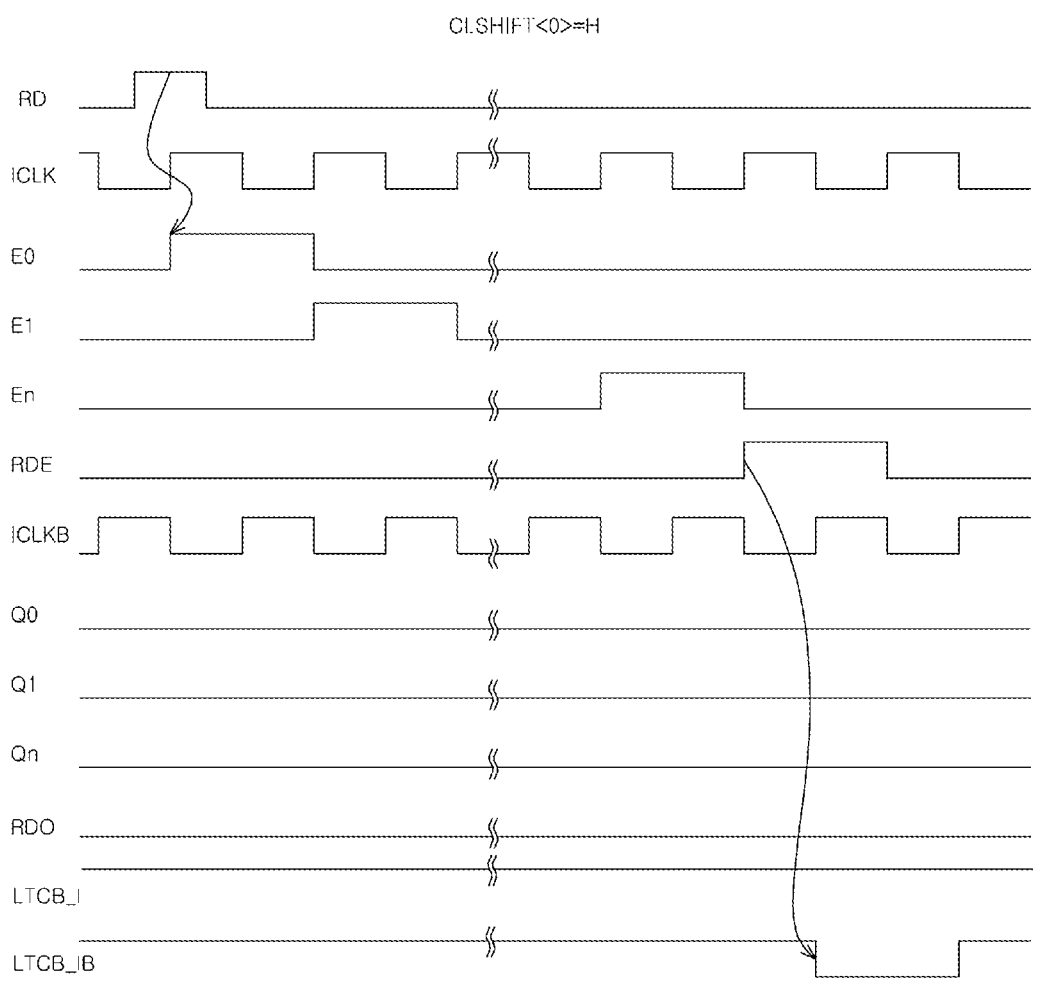

The operation of the domain conversion unit 300 in response to the least significant bit of the column timing signal CLSHIFT<0> having a high level and a read command RD being received based on a rising edge of the first divided internal clock signal ICLK will be described below with reference to FIGS. 3, 4 and 7.

The read command RD is responsively shifted through the first shift path 310 and the first preliminary signal RDE is generated.

When the least significant bit of the column timing signal CLSHIFT<0> has a high level, the first preliminary signal RDE may be inverted by a logic element combination of the first NAND gate ND1, the first transmission gate TG1, and the second and third inverters IV2, IV3, may be shifted by a half clock cycle tCK based on the first divided internal clock signal ICLK, and may be generated as the first internal signal Q1.

Since the second preliminary signal RDO is maintained at a low level, the second internal signal Q2 may be generated at a high level.

The first internal signal Q1 may cause the second time domain conversion signal LTCB_IB to transition to a low level via a logic element combination of the sixth NAND gate ND6 and the seventh inverter IV7.

In addition, when the second internal signal Q2 has a high level, the first time domain conversion signal LTCB_I may be maintained at a high level.

Figure 8:
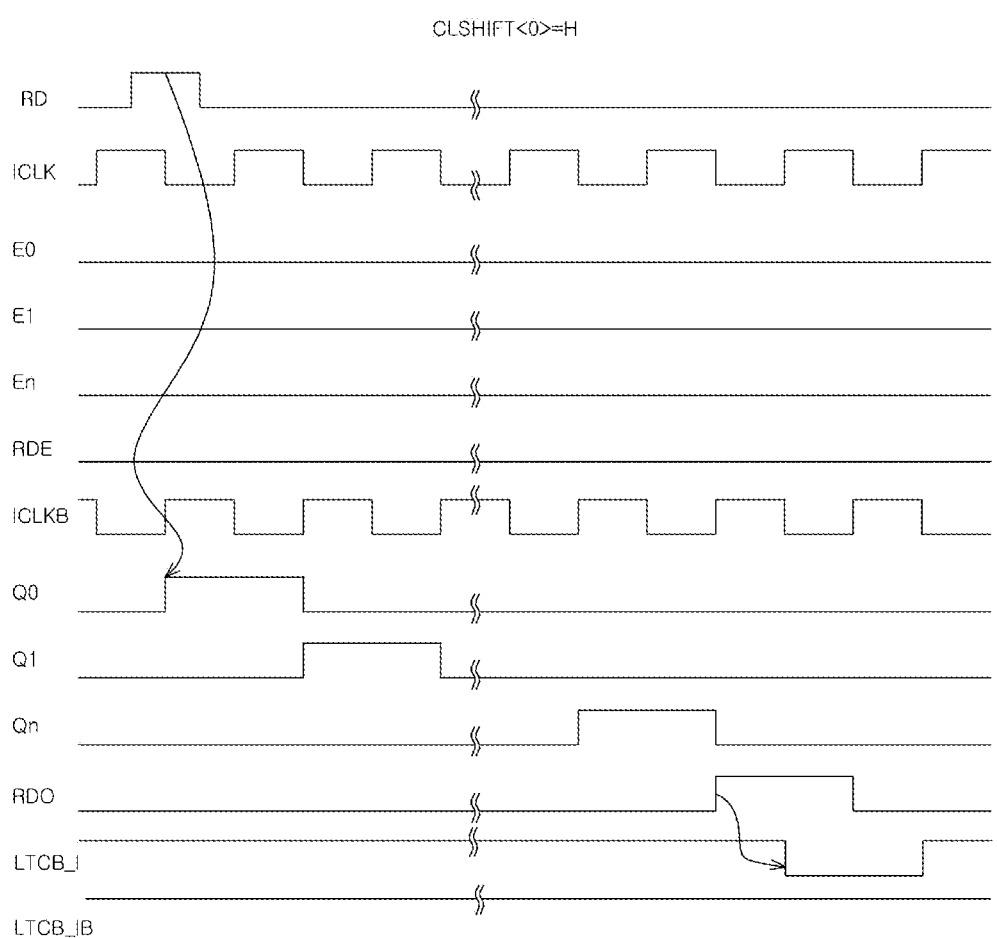

The operation of the domain conversion unit 300 in response to the least significant bit of the column timing signal CLSHIFT<0> having a high level and the read command RD being received based on a rising edge of the second divided internal clock signal ICLKB will be described below with reference to FIGS. 3, 4 and 8.

The read command RD is responsively shifted through the second shift path 320 and the second preliminary signal RDO is generated.

When the least significant bit of the column timing signal CLSHIFT<0> has a high level, the second preliminary signal RDO may be inverted a logic element combination of the fourth NAND gate ND4, the second transmission gate TG2, and the fourth and fifth inverters IV4 and IV5, may be shifted by a half clock cycle tCK based on the second divided internal clock signal ICLKB, and may be generated as the second internal signal Q2.

Since the first preliminary signal RDE is maintained at a low level, the first internal signal Q1 may be generated at a high level.

The second internal signal Q2 may cause the first time domain conversion signal LTCB_I to transition to a low level via a logic element combination of the fifth NAND gate ND5 and the sixth inverter IV6.

In addition, since the first internal signal Q1 has a high level, the second time domain conversion signal LTCB_IB may be maintained at a high level.

Figure 9:
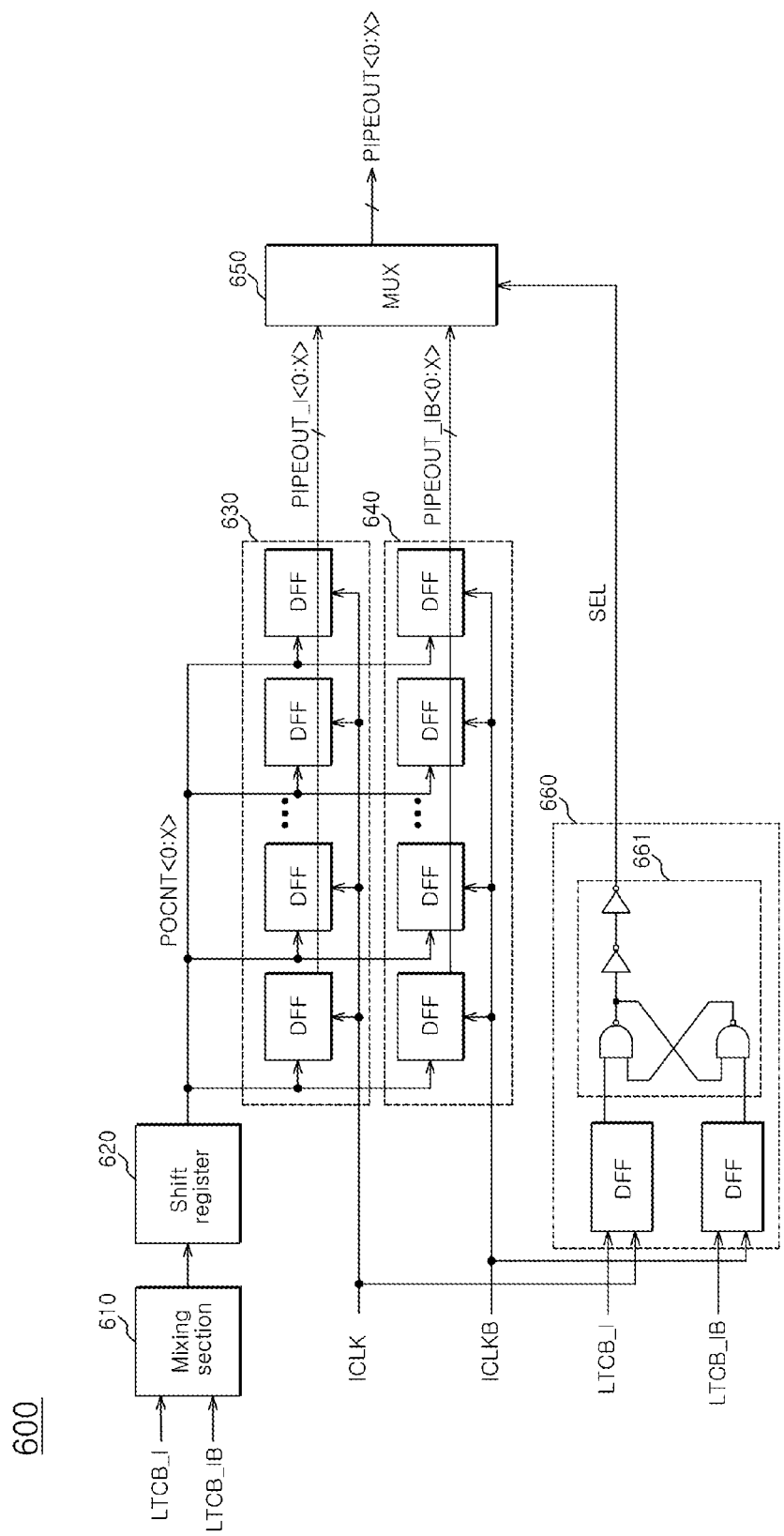
FIG. 9 is a block diagram representation of an embodiment of the alignment control unit 600 of FIG. 2.

Referring to FIG. 9, an embodiment of the alignment control unit 600 of FIG. 2 may include a mixing section 610, a shift register 620, a first shift block 630, a second shift block 640, a multiplexing section 650, and a multiplexing control section 660.

The mixing section 610 may be configured to receive the first time domain conversion signal LTCB_I and the second time domain conversion signal LTCB_IB as inputs and responsively generate a resultant signal.

The shift register 620 may be configured to receive the resultant signal of the mixing section 610 as an input, count the received resultant signal, and generate count signals POCNT<0:X>.

The first shift block 630 may include a plurality of flip-flops DFF. The plurality of flip-flops DFF may be configured to latch the signal bits of the count signals POCNT<0:X> in response to a rising edge of the first divided internal clock signal ICLK and generate output signals PIPEOUT_I<0:X>.

The second shift block 640 may include a plurality of flip-flops. The plurality of flip-flops DFF may be configured to latch the signal bits of the count signals POCNT<0:X> in response to a rising edge of the second divided internal clock signal ICLKB and generate output signals PIPEOUT_IB<0:X>.

The multiplexing section 650 may be configured to generate either the output signals PIPEOUT_I<0:X> of the first shift block 630 or the output signals PIPEOUT_IB<0:X> of the second shift block 640 as the alignment control signals PIPE_OUT<0:X> in response to a select signal SEL.

The multiplexing section 650 may be configured to generate the output signals PIPEOUT_I<0:X> of the first shift block 630 as the alignment control signals PIPE_OUT<0:X> in when the select signal SEL is set.

The multiplexing section 650 may be configured to generate the output signals PIPEOUT_IB<0:X> of the second shift block 640 as the alignment control signals PIPE_OUT<0:X> in when the select signal SEL is reset.

The multiplexing control section 660 may be configured to generate the select signal SEL in response to the first time domain conversion signal LTCB_I, the second time domain conversion signal LTCB_IB, the first divided internal clock signal ICLK and the second divided internal clock signal ICLKB.

The multiplexing control section 660 may include a plurality of flip-flops DFF and an SR latch 661.

The multiplexing control section 660 may be configured to set the select signal SEL in response to the first time domain conversion signal LTCB_I and the first divided internal clock signal ICLK, and may be configured to reset the select signal SEL in response to the second time domain conversion signal LTCB_IB and the second divided internal clock signal ICLKB.

Figure 10:
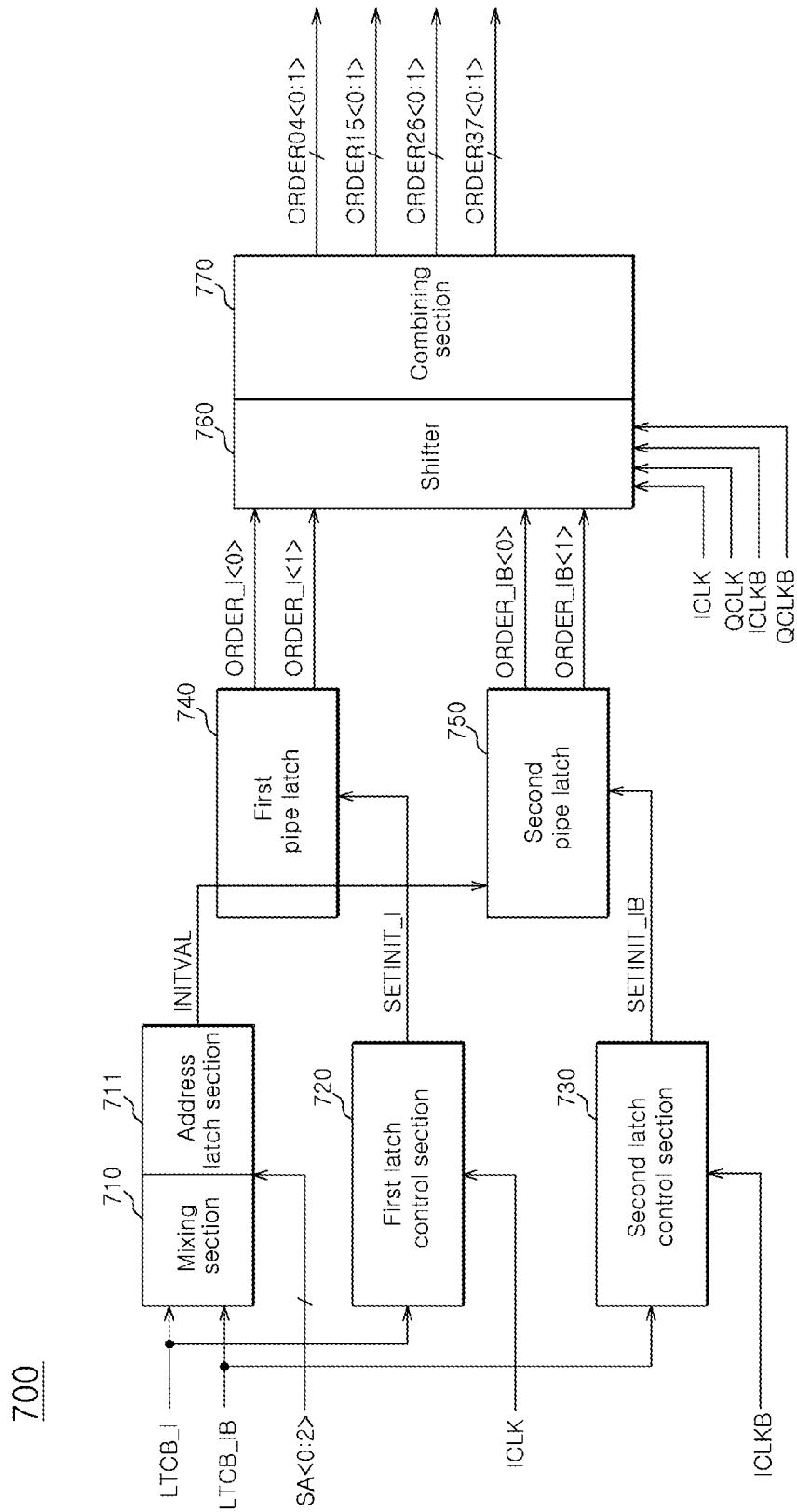
FIG. 10 is a block diagram representation of an embodiment of the order control unit 700 of FIG. 2.

Referring to FIG. 10, an embodiment of the order control unit 700 may include a mixing section 710, an address latch section 711, a first latch control section 720, a second latch control section 730, a first pipe latch 740, a second pipe latch 750, a shifter 760, and a combining section 760.

The mixing section 710 may be configured to receive the first time domain conversion signal LTCB_I and the second time domain conversion signal LTCB_IB as inputs and responsively generate a resultant signal.

The address latch section 711 may be configured to latch one of address signals SA<0:2> received with the read command RD based on the resultant signal received from the mixing section 710, and generate an output signal INITVAL.

The first latch control section 720 may be configured to latch the first time domain conversion signal LTCB_I according to the first divided internal clock signal ICLK and to generate an output signal SETINIT_I.

The second latch control section 730 may be configured to latch the second time domain conversion signal LTCB_IB according to the second divided internal clock signal ICLKB and to generate an output signal SETINIT_IB.

The first pipe latch 740 may be configured to align the output signal INITVAL received from the address latch section 711 according to the output signal SETINIT_I of the first latch control section 720 and to generate alignment signals ORDER_I<0:1>.

The second pipe latch 750 may be configured to align the output signal INITVAL received from the address latch section 711 according to the output signal SETINIT_IB of the second latch control section 730, and to generate alignment signals ORDER_IB<0:1>.

The shifter 760 may be configured to shift and output the received alignment signals ORDER_I<0:1>, ORDER_IB<0:1> in response to the first, second, third and fourth divided internal clock signals ICLK, ICLKB, QCLK, QCLKB.

The combining section 770 may be configured to combine the output signals generated by the shifter 760. In an embodiment, the combining section 770 may be configured to perform an AND operation on the received the output signals generated by the shifter 760 in accordance with a preset rule and to generate the order control signals ORDER04<0:1>, ORDER15<0:1>, ORDER26<0:1>, ORDER37<0:1>.

Figure 11:
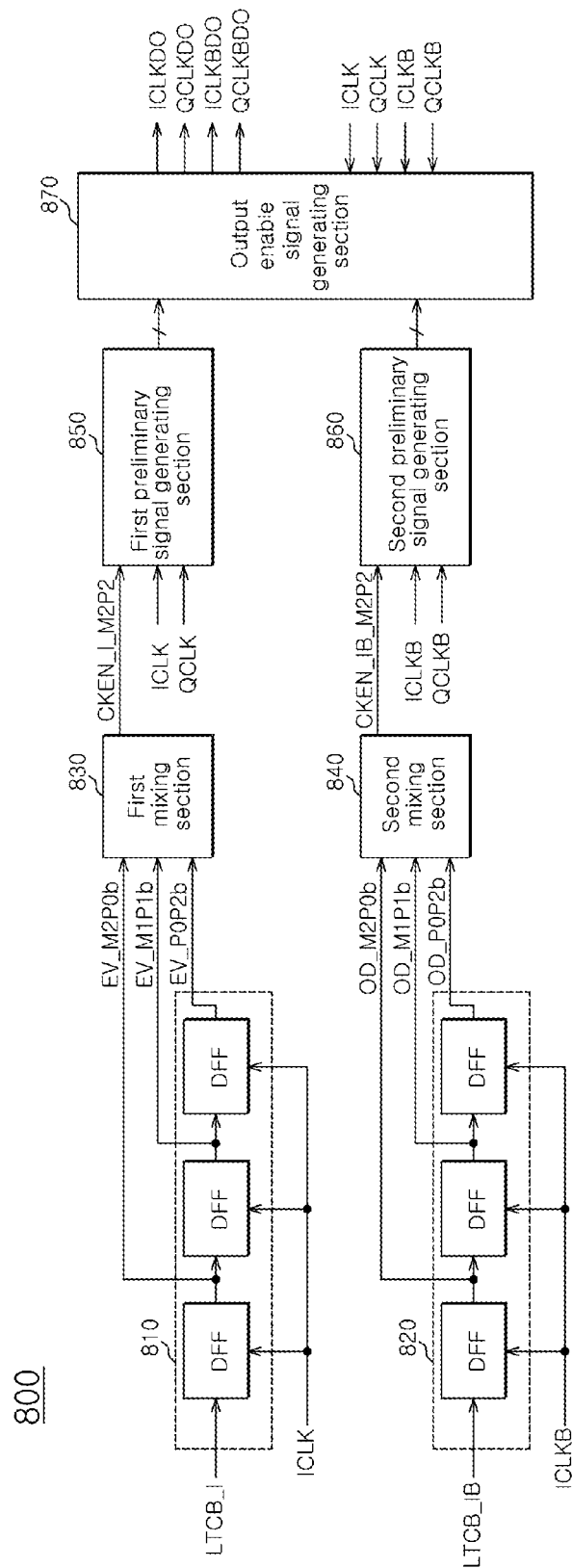
FIG. 11 is a block diagram representation of an embodiment of the output control unit 800 of FIG. 2.

Referring to FIG. 11, an embodiment of the output control unit 800 may include a first latch array 810, a second latch array 820, a first mixing section 830, a second mixing section 840, a first preliminary signal generating section 850, a second preliminary signal generating section 860, and an output enable signal generating section 870.

The first latch array 810 may be configured to sequentially shift the first time domain conversion signal LTCB_I according to the first divided internal clock signal ICLK and to generate output signals EV_M2P0$b$, EV_M1P1$b$, EV_P0P2$b$.

In the output signal EV_M2P0$b$, M2 may mean the difference of a minus two clock cycles tCK from the CAS latency CL, and P0 may mean the difference of a plus zero clock cycle tCK from the CAS latency CL.

In other words, the output signal EV_M2P0$b$ may have a pulse width ranging from approximately the CAS latency CL minus two clock cycles CL−2 to approximately the CAS latency CL plus zero clock cycles CL+0. The output signal EV_M1P1$b$ may have a pulse width ranging from approximately the CAS latency CL minus one clock cycle CL−1 to approximately the CAS latency CL plus one clock cycle CL+1.

In other examples, M05 may be defined as the CAS latency CL minus one half of a clock cycle CL−0.5, and M35 may defined as the CAS latency CL minus three and one half clock cycles CL−3.5.

The signals described below may have the timings described above.

The second latch array 820 may be configured to sequentially shift the received second time domain conversion signal LTCB_IB according to the second divided internal clock signal ICLKB, and generate output signals OD_M2P0b, OD_M1P1b, OD_P0P2b.

The first mixing section 830 may be configured to mix the output signals EV_M2P0b, EV_M1P1b, EV_P0P2b received from the first latch array 810 and to generate a first source signal CKEN_I_M2P2.

The second mixing section 840 may be configured to mix the output signals OD_M2P0b, OD_M1P1b, OD_P0P2b received from the second latch array 820 and to generate a second source signal CKEN_IB_M2P2.

The first preliminary signal generating section 850 may be configured to generate preliminary signals with timing differences in response to the first divided internal clock signal ICLK, the third divided internal clock signal QCLK and the first source signal CKEN_I_M2P2.

The second preliminary signal generating section 860 may be configured to generate preliminary signals with timing differences in response to the second divided internal clock signal ICLKB, the fourth divided internal clock signal QCLKB and the second source signal CKEN_IB_M2P2.

The output enable signal generating section 870 may be configured to multiplex the first, second, third and fourth divided internal clock signals ICLK, ICLKB, QCLK, QCLKB according to a combination of the preliminary signals generated by the first and second preliminary signal generating sections 850, 860, and to generate the output enable signals ICLKDO, ICLKBDO, QCLKDO, QCLKBDO.

The output enable signal generating section 870 may be configured to multiplex the first, second, third and fourth divided clock signals ICLK, ICLKB, QCLK, QCLKB according to a combination of the preliminary signals generated by the first and second preliminary signal generating sections 850, 860 and a part of the output signals EV_M2P0b, EV_M1P1b, EV_P0P2b, OD_M2P0b, OD_M1P1b OD_P0P2b of the first and second latch arrays 810, 820, and to generate the output enable signals ICLKDO, ICLKBDO, QCLKDO, QCLKBDO.

Figure 12:
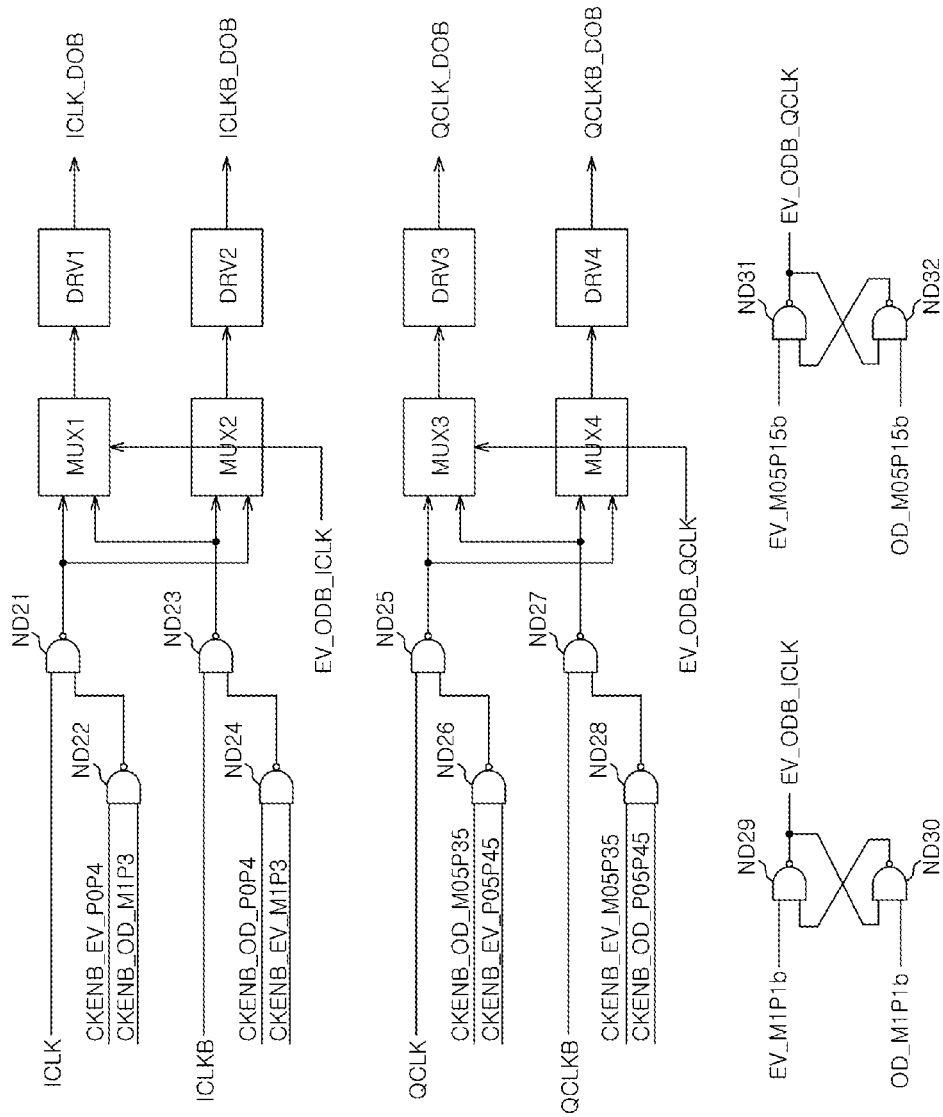
FIG. 12 is a circuit diagram representation of an embodiment of the output enable signal generating section of FIG. 11.

Referring to FIG. 12, an embodiment of the output enable signal generating section 870 may include a plurality of NAND gates ND21-ND32, first, second, third and fourth multiplexers MUX1. MUX2, MUX3, MUX4, and first, second, third and fourth drivers DRV1, DRV2, DRV3, DRV4.

The NAND gate ND22 receives the preliminary signal CKENB_EV_P0P4 generated by the first preliminary signal generating section 850 and the preliminary signal CKENB_OD_M1P3 generated by the second preliminary signal generating section 860 as inputs and generates an output resultant signal. The NAND ND24 gate receives the preliminary signal CKENB_EV_M1P3 generated by the first preliminary signal generating section 850 and the preliminary signal CKENB_OD_P0P4 generated by the second preliminary signal generating section 860 as inputs and generates an output resultant signal. The NAND gate ND26 receives the preliminary signal CKENB_EV_P05P45 generated by the first preliminary signal generating section 850 and the preliminary signal CKENB_OD_M05P35 generated by the second preliminary signal generating section 860 as inputs and generates an output resultant signal. THE NAND gate ND28 receives the preliminary signal CKENB_EV_M05P35 generated by the first preliminary signal generating section 850 and the preliminary signal CKENB_OD_P05P45 generated by the second preliminary signal generating section 860 as inputs and generates an output resultant signal.

The NAND gate ND21 receives the output resultant signal generated by the NAND gate ND22 and the first divided internal clock signal ICLK as inputs and generates a resultant output signal. The NAND gate ND23 receives the output resultant signal generated by the NAND gate ND24 and the second divided internal clock signal ICLKB as inputs and generates a resultant output signal. The NAND gate ND25 receives the output resultant signal generated by the NAND gate ND26 and the third divided internal clock signal QCLK as inputs and generates a resultant output signal. The NAND gate ND27 receives the output resultant signal generated by the NAND gate ND28 and the fourth divided internal clock signal QCLKB as inputs and generates a resultant output signal.

The first multiplexer MUX1 selects and outputs one of the output resultant signals of the NAND gates ND21 and the NAND gate ND23 according to a control signal EV_ODB_ICLK.

The second multiplexer MUX2 selects and outputs one of the output resultant signals of the NAND gate ND21 and the NAND gate ND23 according to the control signal EV_ODB_ICLK.

The third multiplexer MUX3 selects and outputs one of the output resultant signals of the NAND gate ND25 and the NAND gate ND27 according to a control signal EV_ODB_QCLK.

The fourth multiplexer MUX4 selects and outputs one of the output resultant signals of the NAND gate ND25 and the NAND gate ND27 according to the control signal EV_ODB_QCLK.

The first, second, third and fourth drivers DRV1, DRV2, DRV3, DRV4 drive the outputs of the first, second, third and fourth multiplexers MUX1, MUX2, MUX3, MUX4, respectively, and output the first, second, third and fourth output enable signals ICLKDO, ICLKBDO, QCLKDO, QCLKBDO, respectively.

The NAND gates ND29 and ND30 operate as an SR latch, and generate the control signal EV_ODB_ICLK according to the output signals EV_M1P1b and OD_M1P1b of the first and second latch arrays 810 and 820.

The NAND gate ND31 and the NAND gate ND32 operate together as an SR latch, and generate the control signal EV_ODB_QCLK according to the preliminary signals EV_M05P15b, OD_M05P15b generated by the first and second preliminary signal generating sections 850, 860.

Figure 13:
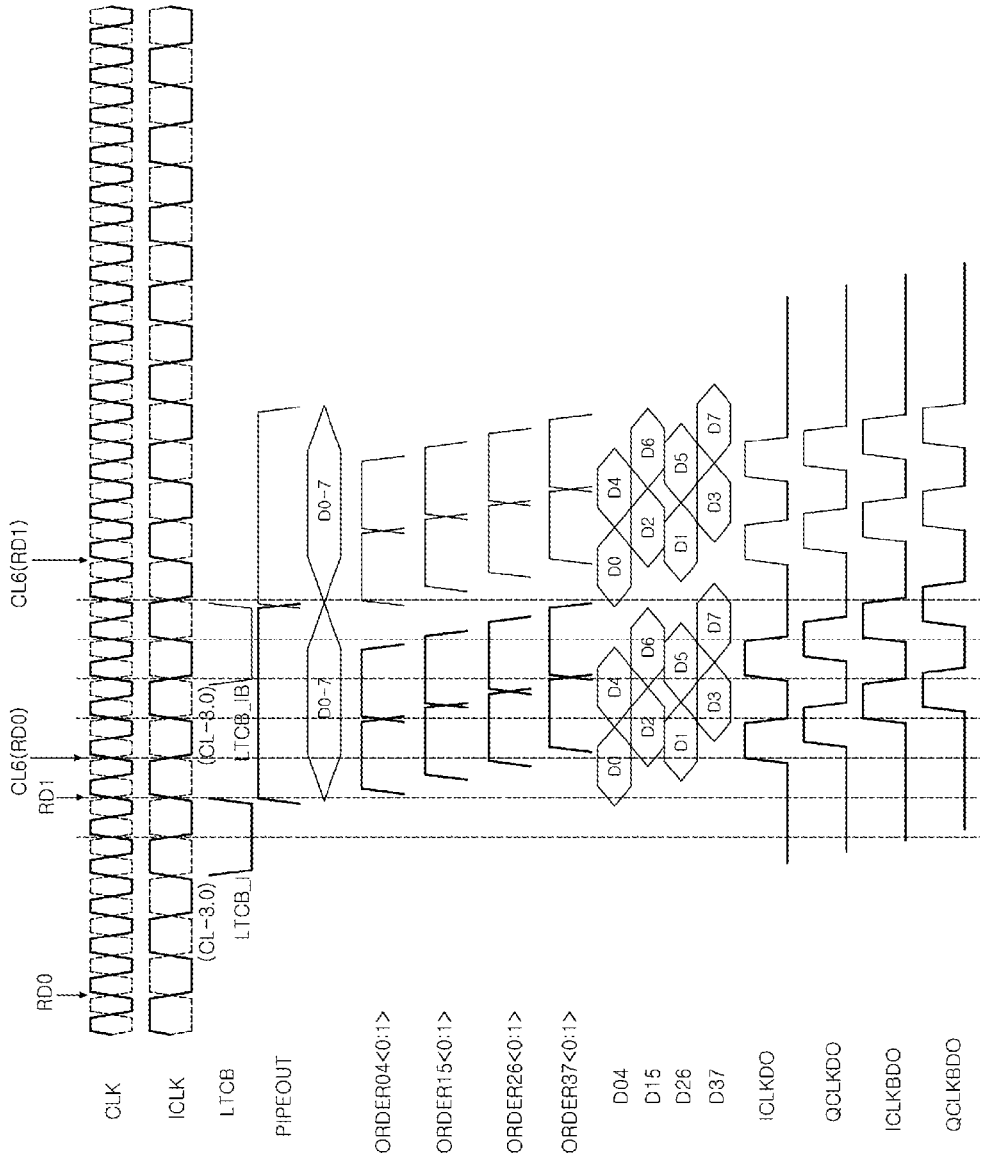
FIG. 13 is an operation timing diagram associated with an operation of an embodiment of the semiconductor apparatus.

An example of a read operation of an embodiment of the semiconductor apparatus 100 will be described below with reference to FIG. 13.

In this example, it will be assumed that the read command RD is sequentially input as RD0 and RD1.

Based on whether the read commands RD0 and RD1 are input based on the rising edge of the first divided clock signal ICLK or the falling edge of the first divided clock signal ICLK, (that is, the rising edge of the second divided clock signal ICLKB) the first time domain conversion signal LTCB_I or the second time domain conversion signal LTCB_IB is selectively generated.

Based on the read commands RD0, RD1, the second time domain conversion signal LTCB_IB and the first time domain conversion signal LTCB_I are each generated in accordance with a respective predetermined timing.

The alignment control signals PIPE_OUT corresponding to the second time domain conversion signal LTCB_IB and the first time domain conversion signal LTCB_I are generated.

The order control signals ORDER04<0:1>, ORDER15<0:1>, ORDER26<0:1>, ORDER37<0:1> corresponding to the second time domain conversion signal LTCB_IB and the first time domain conversion signal LTCB_I are generated.

The alignment data D04, D15, D26, D37 are generated according to the alignment control signals PIPE_OUT and the order control signals ORDER04<0:1>, ORDER15<0:1>, ORDER26<0:1>, ORDER37<0:1>.

The output enable signals ICLKDO, ICLKBDO, QCLKDO, QCLKBDO are generated according to the second time domain conversion signal LTCB_IB and the first time domain conversion signal LTCB_I.

The alignment data D04, D15, D26, D37 are output from the semiconductor apparatus 100 according to the output enable signals ICLKDO, ICLKBDO, QCLKDO, QCLKBDO.

Figure 14:
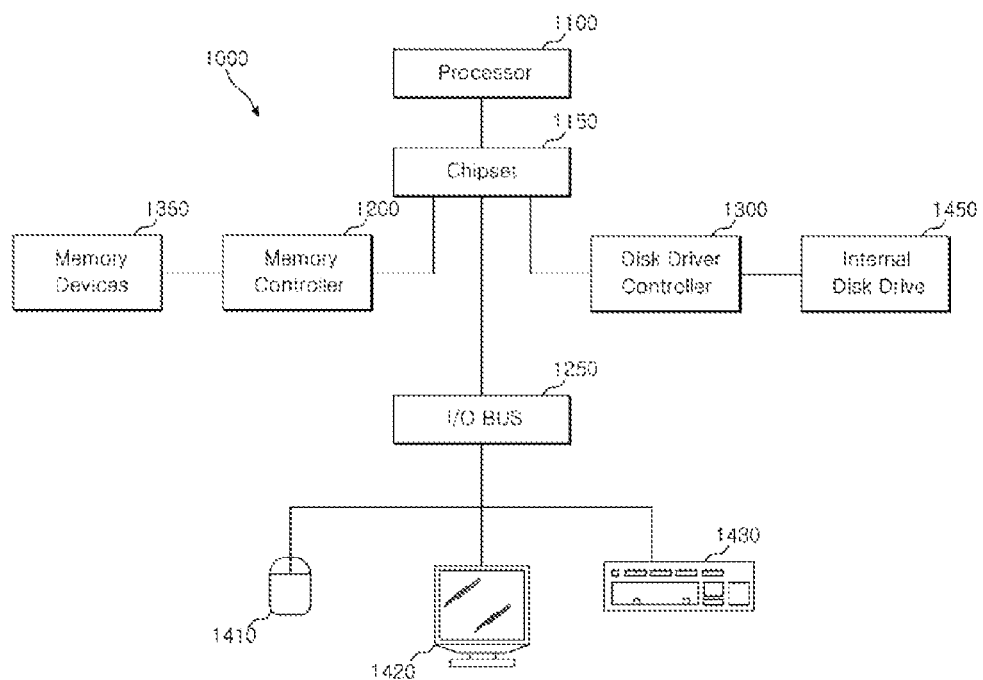
FIG. 14 is a block diagram representation of a system including an embodiment of the semiconductor apparatus.

Referring to FIG. 14, a block diagram representation of a system 1000 including an embodiment of a semiconductor memory apparatus 1350 is shown. In an embodiment, the semiconductor memory apparatus 1350 is the semiconductor apparatus 100 shown in FIG. 2.

An embodiment of the semiconductor memory apparatus 1350 may include a delay-locked loop configured to divide at least one delay-locked clock signal to generate a plurality of divided clock signals, wherein the at least one delay-locked clock signal is generated in response to at least one external clock signal, a domain conversion unit configured to generate first and second time domain conversion signals in response to a read command, first and second of the plurality of divided clock signals, and at least one column timing signal, a read operation control circuit configured to generate at least one read operation control signal in response to an activated signal and the plurality of divided clock signals, wherein the activated signal is one of the first and second time domain conversion signals, and a read path configured to transmit data from the semiconductor apparatus in response to the read command and the at least one read operation control signal.

An embodiment of the semiconductor memory apparatus 1350 may include a read path configured to transmit data from the semiconductor apparatus in response to a read command and at least one read operation control signal, and an operation control circuit configured to receive a plurality of divided clock signals and the read command to identify the one of the plurality of divided clock signals that is relatively better matched to the received read command to manage timings associated with at least one of the read operation control signals.

Examples of the semiconductor memory apparatus 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more semiconductor memory apparatuses 1350. The semiconductor memory apparatuses 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 14 is merely one example of a system employing a semiconductor memory apparatus 1350. In alternate embodiments, such as cellular phones or digital cameras, the components may differ from the embodiment shown in FIG. 14.

While various embodiments have been described above, it will be understood to those skilled in the art that the embodiments described are by way of example only. Accordingly, the semiconductor apparatus configured to manage an operation timing margin described herein should not be limited based on the described embodiments.

What is claimed is:
1. A semiconductor apparatus comprising:
   a delay-locked loop configured to divide at least one delay-locked clock signal to generate a plurality of divided internal clock signals, wherein the at least one delay-locked clock signal is generated based on at least one external clock signal;
   a domain conversion unit configured to:
     generate first and second time domain conversion signals based on a read command, first and second of the plurality of divided internal clock signals, and at least one column timing signal;
     activate the first time domain conversion signal when timing associated with the read command is relatively more synchronized with the first divided internal clock signal than the second divided internal clock signal;

activate the second time domain conversion signal when the timing associated with the read command is relatively more synchronized with the second divided internal clock signal than the first divided internal clock signal;

a read operation control circuit configured to generate at least one read operation control signal based on the activated time domain conversion signal and the plurality of divided internal clock signals; and a read path configured to transmit data from the semiconductor apparatus based on the read command and the at least one read operation control signal.

2. The semiconductor apparatus according to claim 1, wherein the at least one column timing signal is generated based on a CAS latency signal.

3. The semiconductor apparatus according to claim 1, wherein the domain conversion unit is configured to determine whether the read command is relatively better matched to the first divided clock signal or the second divided clock signal to activate one of the first and second time domain conversion signals based on the determination.

4. The semiconductor apparatus according to claim 1, wherein the domain conversion unit is configured to apply a latency corresponding to the at least one column timing signal to the activated one of the first and second time domain conversion signals based on the read command.

5. The semiconductor apparatus according to claim 1, wherein the domain conversion unit comprises:
a first shift path configured to shift the read command in response to shift control signals and the first divided internal clock signal to generate a first preliminary signal;
a second shift path configured to shift the read command in response to the shift control signals and the second divided clock signal to generate a second preliminary signal;
a decoder configured to ignore one signal bit of the at least one column timing signal and to decode the remaining signal bits of the at least one column timing signal to generate the shift control signals; and
a signal generating section configured to activate one of the first and second time domain conversion signals in response to the first preliminary signal, the second preliminary signal and the one signal bit of the at least one column timing signal.

6. The semiconductor apparatus according to claim 1, wherein the read operation control circuit comprises:
an alignment control unit configured to generate at least one alignment control signal as at least one of the read operation control signals in response to the activated one of the first and second time domain conversion signals and the first and second divided internal clock signals; and
an output control unit configured to generate output enable signals as the remaining at least one read operation control signals in response to the activated one of the first and second time domain conversion signals and the plurality of divided internal clock signals.

7. The semiconductor apparatus according to claim 6, wherein the alignment control unit comprises:
a mixing section configured to mix the first time domain conversion signal and the second time domain conversion signal to generate an output signal;
a shift register configured to count the output signal received from the mixing section to generate at least one count signal;

a first shift block configured to latch signal bits of the at least one count signal by using the first divided internal clock signal to generate output signals;
a second shift block configured to latch the signal bits of the at least one count signal by using the second divided internal clock signal to generate output signals;
a multiplexing section configured to generate one of the output signals of the first shift block and the output signals of the second shift block as the at least one alignment control signal in response to a select signal; and
a multiplexing control section configured to generate the select signal in response to the first time domain conversion signal, the second time domain conversion signal, the first divided internal clock signal and the second divided internal clock signal.

8. The semiconductor apparatus according to claim 7, wherein the multiplexing control section is configured to set the select signal in response to the first time domain conversion signal and the first divided internal clock signal, and reset the select signal in response to the second time domain conversion signal and the second divided internal clock signal.

9. The semiconductor apparatus according to claim 6, wherein the output control unit comprises:
a first latch array configured to sequentially shift the first time domain conversion signal according to the first divided internal clock signal to generate output signals;
a second latch array configured to sequentially shift the second time domain conversion signal according to the second divided internal clock signal to generate output signals;
a first mixing section configured to mix the output signals of the first latch array to generate a first source signal;
a second mixing section configured to mix the output signals of the second latch array to generate a second source signal;
a first preliminary signal generating section configured to generate preliminary signals with timing differences in response to at least one of the plurality of divided internal clock signals and the first source signal;
a second preliminary signal generating section configured to generate preliminary signals with timing differences in response to a remainder of the plurality of divided internal clock signals and the second source signal; and
an output enable signal generating section configured to multiplex the plurality of divided internal clock signals according to a combination of the preliminary signals generated by the first preliminary signal generating section and the preliminary signals generated by the second preliminary signal generating section to generate the output enable signals.

10. The semiconductor apparatus according to claim 6, wherein the read operation control circuit further comprises:
an order control unit configured to generate order control signals as the remaining read operation control signals in response to the activated one of the first and second time domain conversion signals and the plurality of divided internal clock signals.

11. The semiconductor apparatus according to claim 1, wherein the read path comprises:
a data output unit including a plurality of pads;
a transmission unit configured to output alignment data to the data output unit in response to at least one of the read operation control signals;

a core block configured to transmit stored data in response to the read command; and a data alignment unit configured to align data output from the core block in response to a remainder of the read operation control signals to generate the alignment data.

12. A semiconductor apparatus comprising:

a read path configured to transmit data from the semiconductor apparatus based on a read command and at least one read operation control signal; and an operation control circuit configured to receive a plurality of divided clock signals and the read command;

select a first one of the plurality of divided clock signals when the first one is relatively better matched to the received read command than a second one of the plurality of divided clock signals;

select the second one of the plurality of divided clock signals when the second one is relatively better matched to the received read command than the first one of the plurality of divided clock signals; and manage timings associated with the at least one read operation control signal based on the selected one of the divided clock signals.

13. The semiconductor apparatus according to claim 12, wherein the plurality of divided clock signals are internal signals generated by dividing at least one delay-locked clock signal generated based on at least one external clock signal.

14. The semiconductor apparatus according to claim 12, wherein the operation control circuit comprises:

a domain conversion unit configured to generate first and second time domain conversion signals in response to the read command, a first one of the plurality of divided clock signals and a second one of the plurality of divided clock signals, and at least one column timing signal; and a read operation control circuit configured to generate at least one read operation control signal in response to the plurality of divided clock signals and an activated signal, wherein the activated signal is one of the first and second time domain conversion signals.

15. The semiconductor apparatus according to claim 14, wherein the at least one column timing signal is generated based on a CAS latency signal.

16. The semiconductor apparatus according to claim 14, wherein the domain conversion unit is configured to apply a latency corresponding to the at least one column timing signal to the activated one of the first and second time domain conversion signals, based on the read command.

17. The semiconductor apparatus according to claim 14, wherein the domain conversion unit comprises:

a first shift path configured to shift the read command in response to shift control signals and the first divided clock signal, and to generate a first preliminary signal;

a second shift path configured to shift the read command in response to the shift control signals and the second divided clock signal, and to generate a second preliminary signal;

a decoder configured to ignore one of the signal bits of the at least one column timing signal and to decode the remaining signal bits of the at least one column timing signal to generate the shift control signals; and a signal generating section configured to activate one of the first and second time domain conversion signals in response to the first preliminary signal, the second preliminary signal and the one signal bit of the at least one column timing signal.

18. The semiconductor apparatus according to claim 14, wherein the read operation control circuit comprises:

an alignment control unit configured to generate alignment control signals as one of the at least one read operation control signals in response to the activated one of the first and second time domain conversion signals and the first and second divided clock signals;

an order control unit configured to generate order control signals as other ones of the at least one read operation control signals, in response to the activated one of the first and second time domain conversion signals and the plurality of divided clock signals; and an output control unit configured to generate output enable signals as the remaining ones of the at least one read operation control signal, in response to the activated one of the first and second time domain conversion signals and the plurality of divided clock signals.

19. The semiconductor apparatus according to claim 12, wherein the read path comprises:

a data output unit including a plurality of pads;

a transmission unit configured to output alignment data to the data output unit in response to a subset of the least one of the read operation control signal;

a core block configured to transmit stored data in response to the read command; and a data alignment unit configured to align data output from a core block in response to a remainder of the at least one read operation control signals to generate the alignment data.

20. The semiconductor apparatus according to claim 12, wherein the operation control circuit comprises a domain conversion unit and a read operation control circuit.

* * * * *